US009039833B2

(12) United States Patent
Tathgar

(10) Patent No.: US 9,039,833 B2
(45) Date of Patent: May 26, 2015

(54) METHOD FOR THE PRODUCTION OF SOLAR GRADE SILICON

(76) Inventor: Harsharn Tathgar, Oslo (NO)

(*) Notice: Subject to any disclaimer, the term of this patent is extended or adjusted under 35 U.S.C. 154(b) by 943 days.

(21) Appl. No.: 13/203,493

(22) PCT Filed: Feb. 25, 2010

(86) PCT No.: PCT/NO2010/000074
§ 371 (c)(1),
(2), (4) Date: Aug. 26, 2011

(87) PCT Pub. No.: WO2010/098676
PCT Pub. Date: Sep. 2, 2010

(65) Prior Publication Data
US 2011/0302963 A1    Dec. 15, 2011

(30) Foreign Application Priority Data

Feb. 26, 2009  (NO) .................................. 20090914

(51) Int. Cl.
*C30B 17/00* (2006.01)
*C01B 33/021* (2006.01)
*C01B 33/037* (2006.01)
*C30B 21/00* (2006.01)
*C30B 29/06* (2006.01)

(52) U.S. Cl.
CPC ............. *C01B 33/021* (2013.01); *C01B 33/037* (2013.01); *C30B 17/00* (2013.01); *C30B 21/00* (2013.01); *C30B 29/06* (2013.01)

(58) Field of Classification Search
USPC ............................... 117/81, 82, 83, 73, 75, 77
See application file for complete search history.

(56) References Cited

U.S. PATENT DOCUMENTS

| | | | |
|---|---|---|---|
| 4,195,067 A | 3/1980 | Kotval et al. | |
| 4,312,846 A | 1/1982 | Dawless | |
| 4,312,847 A | 1/1982 | Dawless | |
| 4,461,671 A * | 7/1984 | Seifert et al. .................... | 117/63 |
| 7,862,585 B2 | 1/2011 | Li et al. | |
| 7,883,680 B2 | 2/2011 | Nichol | |
| 2001/0051387 A1 | 12/2001 | Nakagawa et al. | |
| 2008/0178793 A1 | 7/2008 | Heuer et al. | |
| 2009/0092535 A1 | 4/2009 | Nichol | |
| 2009/0101301 A1 | 4/2009 | Megumi et al. | |
| 2009/0161301 A1 | 6/2009 | Woody et al. | |
| 2009/0208401 A1 | 8/2009 | Megumi et al. | |
| 2009/0268401 A1 | 10/2009 | Krah | |
| 2009/0274607 A1 | 11/2009 | Nichol | |
| 2010/0143231 A1 | 6/2010 | Nishio et al. | |
| 2010/0237272 A1 * | 9/2010 | Chaudhari et al. ......... | 252/62.55 |
| 2010/0254879 A1 | 10/2010 | Nichol | |

FOREIGN PATENT DOCUMENTS

| | | |
|---|---|---|
| DE | 3019875 C2 | 5/1980 |
| EP | 0002135 A1 | 11/1978 |
| EP | 0028811 A1 | 11/1980 |
| WO | 2007112592 A1 | 10/2007 |
| WO | 2008110012 A1 | 9/2008 |
| WO | 2009003183 A1 | 12/2008 |
| WO | 2009012583 A1 | 1/2009 |
| WO | 2011020197 A1 | 2/2011 |

OTHER PUBLICATIONS

European Office Action of the corresponding European application dated Feb. 6, 2013.

\* cited by examiner

*Primary Examiner* — Robert M Kunemund
(74) *Attorney, Agent, or Firm* — Bacon & Thomas, PLLC

(57) ABSTRACT

The present invention relates to a method for the preparation of solar grade silicon comprising crystallization of large high purity silicon crystals in a hyper eutectic binary or ternary alloy containing silicon, or a refined silicon melt, wherein small silicon crystals are added to the melt and the resulting large silicon crystals are separated from the melt. The separation may be performed by centrifugation or filtration.

10 Claims, 3 Drawing Sheets

Separation of silicon crystals by centrfuging.

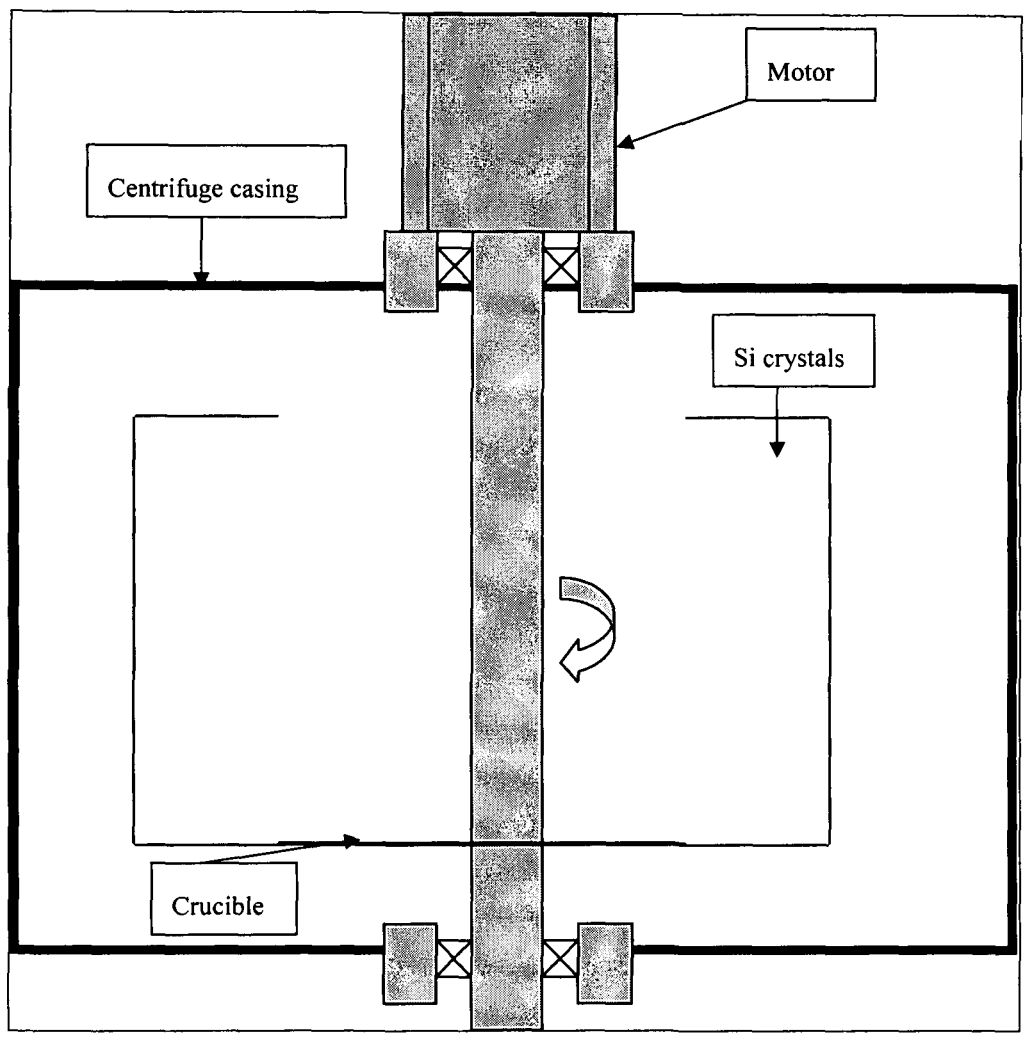
Figure 3: Separation of silicon crystals by centrfuging.

METHOD FOR THE PRODUCTION OF SOLAR GRADE SILICON

BACKGROUND OF THE INVENTION

The present invention relates to methods for the separation of high purity silicon crystal from hyper eutectic binary or ternary Si containing alloys or from refined silicon melts.

The development of new techniques and products for the low-cost utilization of non-polluting energy sources has attracted considerable interest during the latest decades. Solar energy is one of the most interesting energy sources since it does not cause any to pollution and since it is abundantly available. Solar energy is converted into electricity by means of the photovoltaic effect, whereby the sunlight is absorbed by so called solar cells. The aim of the present invention is to provide low-cost silicon materials for use in solar cells.

Traditionally solar grade silicon has been produced by the Siemens process. The key feature of this process is chemical vapour deposition (CVD). The Siemens process is an energy consuming and high-cost process. The material obtained by the Siemens process is of a purity (>11N) suitable for electronic applications such as semiconductors. Silicon for Solar cell materials may have a lower purity (>5N) and still be suitable for use in the photovoltaic process, wherein N designates the number of 9-digits in the purity of the material.

In recent years a direct process has been used, making use of quartz and carbon, the so called Elkem or Fesil process. The product is molten silicon and is commonly known as UMG-Si (upgraded metallurgical grade silicon) or SoG-Si (Solar grade silicon). The process operates at high temperature (>1400° C.) and is thus also a process consuming considerable energy and materials choice is a big challenge at those temperatures.

U.S. Pat. No. 4,124,410 describes a multigrained, epitaxial n-on-p-on-p substrate planar layer diode comprising p- and n-type epitaxial layers grown on a passive p-type, multigrained, silicon substrate where said layers duplicate the underlaying substrate grain secondary structure. The silicon substrate is prepared by removing silicon platelets from a solution of metallurgical grade silicon in a liquid metal solvent, melting of said partially purified silicon platelets in contact with acid silica slag in a melting zone and pulling refined metallurgical silicon boules from a melt of thus refined silicon on a rotating silicon seed rod. The substrate is produced at a substantially higher impurity level than in conventional high purity semiconductor grade silicon, while the resulting low-cost diode have solar cell properties.

WO 2007/112592 A1 describes a method for purifying silicon. In said method a first molten liquid is formed from silicon and a solvent metal, this first molten liquid is then contacted with a first gas to provide dross and a second molten liquid, whereupon the dross and the second molten liquid is separated. The second molten liquid is then cooled to form silicon crystals and a mother liquid, the crystals are then separated from the mother liquid.

All the known methods for the preparation of silicon suitable for use as solar cells are thus methods consuming considerable costs and energy.

It is an object of the invention to provide refined metallurgical material useful for solar is cell applications or readily convertible to such silicon material.

The object of the present invention is thus to provide an alternative process for the preparation of solar grade silicon which is less energy consuming and which allows greater flexibility with regard to starting materials.

SUMMARY OF THE INVENTION

The present invention thus relates to a process for the preparation for solar grade silicon comprising crystallization of large (ca. 1-5 mm) high purity silicon crystals in a hyper eutectic, molten binary or ternary alloy containing silicon (>15 wt % Si) or a refined silicon melt, wherein small (ca. 100-200 µm) silicon crystals are added to the melt and the resulting large crystals are separated by centrifugation or filtration.

The alloy is preferable an Al—Si, Zn—Si or Al—Zn—Si alloy. More preferable the alloy is an Al—Si alloy.

The present invention also relates to a semi-continuous process for the formation, separation and melting of large (ca. 1-5 mm) and pure silicon crystals, wherein a prepurified binary or ternary over eutectic alloy containing Si, or a refined silicon melt, is transferred to a furnace having a temperature gradient from top to bottom, small (ca. 100-200 µm) and pure silicon crystals are then added to the melt and grow due to the temperature difference until the melt in the furnace reaches eutectic composition, whereupon the melt is transported from the furnace and brought to the over eutectic state, is then returned to the furnace and the process is repeated until an amount (>100 kg) of large Si— crystals has been formed.

In a preferred embodiment the prepurification and provision of the melt to the over eutectic state is performed in a first furnace connected to the furnace used in said method.

In a further preferred embodiment the melt containing large silicon crystals obtained in the furnace is transferred to a centrifugal kept just above the eutectic temperature of the melt, whereupon the crystals are pushed towards the walls of the centrifugal and the Si containing melt will remain in the middle thereof and is decanted from the centrifugal.

BRIEF DESCRIPTION OF THE DRAWINGS

Embodiments of the invention may best be understood by referring to the following description and the accompanying drawings which illustrate such embodiments.

In the drawings:

FIG. 3 illustrates a further embodiment of the present invention also comprising centrifugation.

DEFINITIONS

Unless otherwise stated, the following terms as used in the present specification shall have the following meanings:

The term "furnace" refers to a furnace of a type normally used within metallurgical industry, such as for instance an induction furnace.

The term "alloy" refers to a homogeneous mixture of two or more metallic elements, at least one of which is a metal, and where the resulting material has metallic properties.

The term "large" as used in connection with crystals refers to crystals of crystal size from about 1 mm to about 5 mm.

The term "small" as used in connection with crystals refers to crystals of a particle size varying from of a particle size varying from about 1 mm to about 5 mm A preferred range may be 3-4 mm (ca. 100-200 mm).

The term "precipitate" refers to the process of causing solid substances, such as crystals, to be separated from a solution. The precipitation may include crystallization.

The term "metallurgical grade silicon" (ca. 99.8%) or "solar grade silicon" (>5N, i.e >99.999%) refers to a relatively pure silicon, i.e. containing at least 98.0% by weight silicon

DETAILED DESCRIPTION OF THE INVENTION

Figure 1:
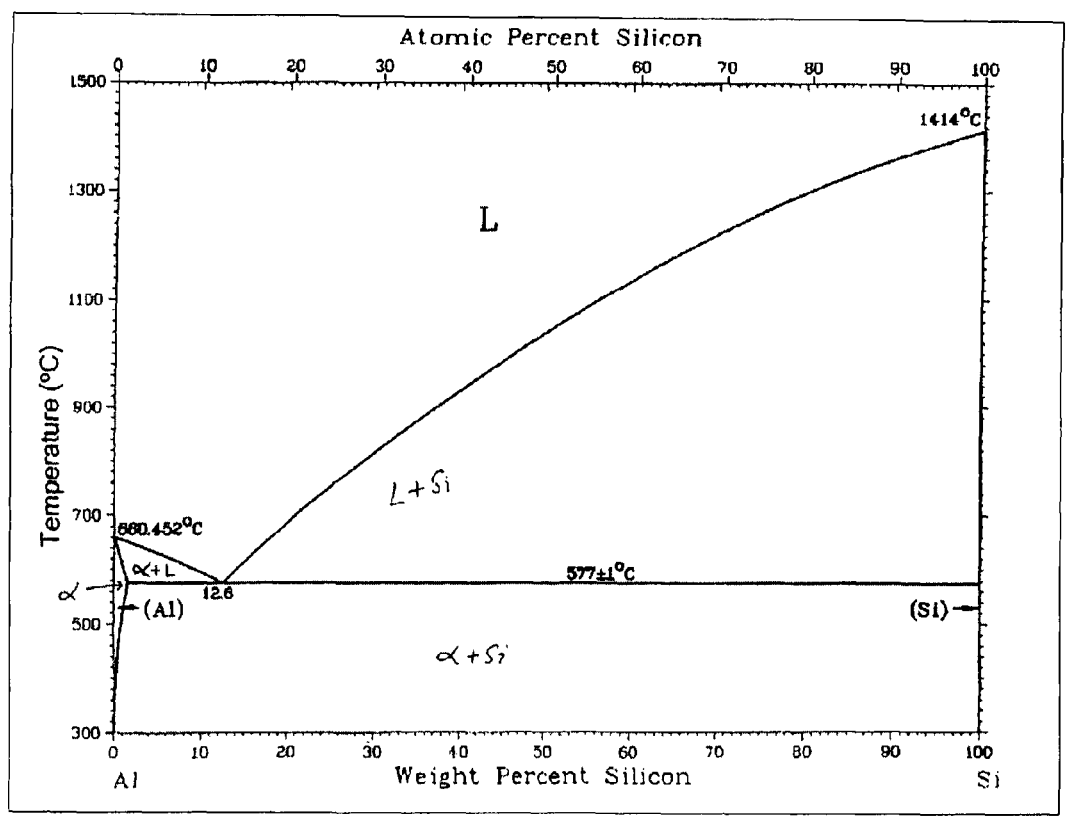
FIG. 1 illustrates the Al—Si phase diagram, indicating eutectic temperature 577° C. and composition Al-12, 6% Si.

More specifically the present invention relates to crystallization of "large" high purity silicon crystals in hypereutectic binary or ternary alloys containing silicon. Use may be made of for instance binary Al—Si or Zn—Si alloys or for instance ternary Al—Zn—Si alloys Or refined silicon melts. For simplicity the present invention will be explained with a main emphasis on the binary Al—Si alloy the phase diagram of which is illustrated in FIG. 1. It should be noted, however, that the method according to the invention will work equally well with the other alloys mentioned.

The refined silicon melt may for instance contain silicon, zinc and chlorine. Preferably use is made of a pre-refined metallurgical silicon with purity >99.9% with low boron and phosphorus content (<1 ppmw).

The present invention thus relates to crystallization of "large" high purity silicon crystals in the hyper eutectic aluminium-silicon molten alloys, or refined silicon melts, by adding "small" silicon crystals and thereafter separating the "large" high purity silicon crystals from the aluminium-silicon melt by centrifugation.

The large high purity silicon crystals will subsequently by etched, preferable using hydrochloric acid or butanol to remove aluminium from the surface and rinsed with distilled water before drying. The material produced by this method will give high purity silicon (>5N) suitable for the preparation of solar cells.

Below two different embodiments of the present invention (filtration and centrifugation) will be described for the separation of large silicon crystals from the melt.

Figure 2:
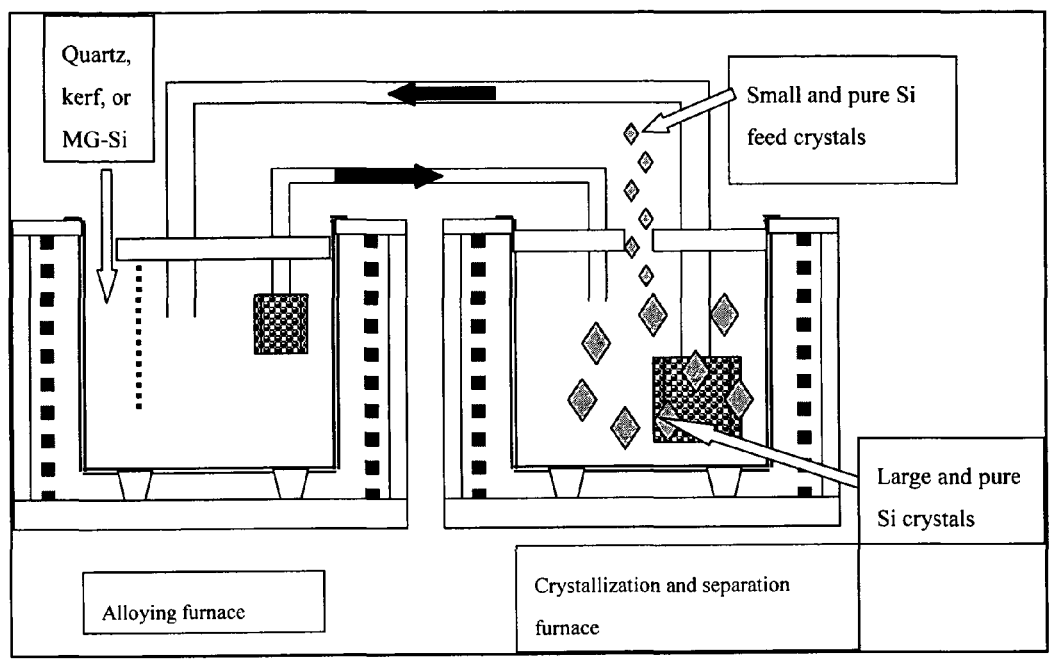
FIG. 2 illustrates a first embodiment of the present invention comprising melting and filtration.

FIG. 2 shows a semi-continuous process for the formation, separation and melting of large and pure silicon crystals. In the left furnace an over eutectic melt, for instance an Al—Si melt (>12.6% Si) is made by dissolving silicon. This silicon may be in the form of for instance quartz, Mg—Si or kerf, in the aluminium melt at a temperature above 700° C. Heavy impurities settle at the bottom (e.g. SiC) and light impurities (e.g. $Al_2O_3$, $SiO_2$) is float to the surface. Pure over eutectic Al—Si alloy (e.g. Al-20% Si) is transferred to the second furnace on the right hand side of FIG. 2 through for instance a ceramic filter (Graphite, SiC, or $Al_2O_3$ or $SiO_2$).

The second furnace has a temperature gradient with high temperature at the top and lower temperature at the bottom. The suitable temperature gradient will depend on the alloy used. For an Al—Si alloy the temperature at the top is preferably within the range of 660 to 680° C. and the temperature at the bottom is preferably 580 to 600° C. Most preferred temperatures for this melt is 680 and 580° C. at top and bottom, respectively. Pure and small silicon crystals are fed to the melt by gravity, or with the help of an impeller (Graphite, SiC, or $Al_2O_3$ or $SiO_2$), and are grown into larger silicon crystals due to temperature difference. After the melt in the second furnace reaches eutectic composition, the melt is pumped back to the first furnace through a ceramic filter (Graphite, SiC, or $Al_2O_3$ or $SiO_2$) to avoid the transfer of large silicon crystals. This process is repeated until a certain amount of large silicon crystals are formed in the second furnace and after that all the Al—Si melt is transferred to the first furnace. The residual pure silicon crystals in the second furnace are melted over 1550° C. and cast in a quartz crucible to an ingot. The ingot is subsequently crushed into small particles, leached, washed and re-melted in quartz crucible to produce solar grade silicon.

In the further embodiment use is made of a centrifugal made of quartz ($SiO_2$) that can be rotated at 700-800 rpm. According to this embodiment melt containing large silicon crystals is transported from the second furnace to a centrifuge. The temperature in the centrifugal will be kept just above the eutectic temperature of 577° C. Silicon crystals will be pushed towards the wall of the crucible and the Al—Si melt will remain in the middle part of the device (cf. FIG. 3). The melt will be decanted out from the crucible and the silicon crystals will be dried and etched with HCl to remove aluminium from the surface and subsequently washed with DI water and dried. The pure crystals obtained may be sold as solar grade silicon to certain applications in solar industry or re-melted and cast as ingots to be sold as solar grade silicon to solar industry.

Since the temperature used in the methods according to the invention is considerably reduced compared to conventional method used for the preparation of solar grade silicon the costs and the energy consumption will also be considerably reduced.

As illustrated above the process according to the invention will also allow greater flexibility as to possible starting materials.

The invention claimed is:

1. A semi-continuous process for the formation, separation and melting of large and pure silicon crystals of a size of 1-5 mm, wherein a prepurified binary or ternary hypereutectic alloy containing Si melt is transferred to a furnace having a temperature gradient from top to bottom, small and pure silicon crystals of a size of 100-200 μm are then added to the melt in the furnace and grow due to the temperature difference until the melt in the furnace reaches eutectic composition, whereupon the melt is transported from the furnace and brought to the hypereutectic state, is then returned to the furnace and the process is repeated until an amount of large (1-5 mm) Si crystals has been formed.

2. The process according to claim 1, wherein the prepurification and the provision of the melt to hypereutectic state is performed in a first furnace connected to the furnace used in the said method.

3. The process according to claim 1, wherein the alloy is a binary Al—Si alloy.

4. The process according to claim 2, wherein the alloy is a binary Al—Si alloy.

5. The process according to claim 1, whereby the melt containing large (1-5 mm) silicon crystals obtained in the furnace is transferred to a centrifugal kept just above the eutectic temperature of the melt, whereupon the crystals are pushed towards the walls of the centrifugal and Si containing melt will remain in the middle thereof and is decanted from the centrifugal.

6. The process according to claim 2, whereby the melt containing large (1-5 mm) silicon crystals obtained in the furnace is transferred to a centrifugal kept just above the eutectic temperature of the melt, whereupon the crystals are pushed towards the walls of the centrifugal and Si containing melt will remain in the middle thereof and is decanted from the centrifugal.

7. The process according to claim 1, wherein the crystals obtained are re-melted and cast as ingots to be used in the solar grade silicon.

8. The process according to claim 2, wherein the crystals obtained are re-melted and cast as ingots to be used in the solar grade silicon.

9. The process according to claim 5, wherein the crystals obtained are re-melted and cast as ingots to be used in the solar grade silicon.

10. An apparatus for the preparation of solar grade silicon, the apparatus comprising:
   a first furnace; and
   a second furnace connected to the first furnace;
   wherein the apparatus is arranged to allow a binary or ternary hypereutectic alloy containing silicon melt to be made in the first furnace and transferred to the second furnace; wherein the second furnace is arranged to have a temperature gradient with a higher temperature at the top of the furnace and a lower temperature at the bottom of the furnace and is arranged to be fed with pure silicon crystals of a size of 100-200 µm which grow in the melt to form larger (1-5 mm) silicon crystals; and wherein the apparatus is arranged to pump melt from the second furnace to the first furnace through a ceramic filter when the melt in the second furnace reaches eutectic composition.

* * * * *